(12) United States Patent
Abe et al.

(10) Patent No.: US 8,669,820 B2
(45) Date of Patent: Mar. 11, 2014

(54) OSCILLATOR CIRCUIT

(75) Inventors: Makio Abe, Tokyo (JP); Fumihiro Inoue, Tokyo (JP); Junichi Kimura, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 105 days.

(21) Appl. No.: 13/343,789

(22) Filed: Jan. 5, 2012

(65) Prior Publication Data
US 2012/0176204 A1 Jul. 12, 2012

(30) Foreign Application Priority Data
Jan. 12, 2011 (JP) .................................. 2011-004052

(51) Int. Cl.
*H03K 3/0231* (2006.01)
*H03K 21/08* (2006.01)

(52) U.S. Cl.
USPC ............. 331/74; 331/111; 331/143; 331/179; 327/115

(58) Field of Classification Search
USPC ........ 331/111, 143, 177 R, 179, 74; 327/113, 327/115, 117
See application file for complete search history.

(56) References Cited

U.S. PATENT DOCUMENTS 5,703,537 A * 12/1997 Bland et al. .................... 331/1 A
7,123,105 B2 * 10/2006 Kim et al. ....................... 331/66
7,511,581 B2 * 3/2009 Lee et al. ......................... 331/34

FOREIGN PATENT DOCUMENTS

JP          08-272478        10/1996

* cited by examiner

*Primary Examiner* — Ryan Johnson
(74) *Attorney, Agent, or Firm* — IPUSA, PLLC

(57) ABSTRACT

An oscillator circuit includes a clock oscillator which outputs a main clock signal having an oscillating frequency switched between a high frequency and a low frequency in response to a frequency selection signal, and a frequency divider circuit which outputs a sub-clock signal having a divided frequency equivalent to a frequency division ratio of the oscillating frequency of the main clock signal, the frequency division ratio being switched in response to the frequency selection signal. The divided frequency of the sub-clock signal is predetermined for each of the high frequency and the low frequency to which the oscillating frequency is switched in response to the frequency selection signal.

3 Claims, 6 Drawing Sheets

OSCILLATOR CIRCUIT

CROSS-REFERENCE TO RELATED APPLICATION

This application is based upon and claims the benefit of priority of Japanese patent application No. 2011-004052, filed on Jan. 12, 2011, the entire contents of which are incorporated by reference in their entirety.

BACKGROUND OF THE INVENTION

1. Field of the Invention

The present disclosure relates to an oscillator circuit.

2. Description of the Related Art

FIG. 5 shows the circuit composition of an oscillator circuit according to the related art. As shown in FIG. 5, in this oscillator circuit, a built-in oscillator 1 generates a clock signal with a frequency on the order of several hundreds of 1 MHz (megahertz). This clock signal is supplied to a frequency divider circuit 2. The frequency divider circuit 2 converts the clock signal into a ½ frequency signal, a ¼ frequency signal, a ⅛ frequency signal, and a 1/16 frequency signal, and supplies each divided frequency signal to a frequency selection circuit 3. The frequency selection circuit 3 selects one of the divided frequency signals according to a selection signal received from a terminal 4, and outputs the selected frequency signal from a terminal 5 as a main clock signal. The main clock signal is supplied to a CPU (which is not illustrated), for example. The selection signal is changed according to the mode of operation of the CPU.

Further, a low-speed clock oscillator 6 generates a low-speed clock signal with a frequency on the order of several tens of 1 kHz (kilohertz). This low-speed clock signal is output from a terminal 7 as a sub-clock signal. The sub-clock signal is supplied to a timer (which is not illustrated), for example.

FIG. 6 shows the circuit composition of another oscillator circuit according to the related art. As shown in FIG. 6, in this oscillator circuit, a low-speed clock oscillator 11 generates a low-speed clock signal with a frequency on the order of several tens of 1 kHz. This low-speed clock signal is output from a terminal 12 as a sub-clock signal. The sub-clock signal is supplied to a timer (which is not illustrated), for example.

Further, the sub-clock signal is supplied to a PLL (phase locked loop) 13. The PLL 13 generates a clock signal with a frequency on the order of several hundreds of 1 MHz, and this clock signal is synchronized with the sub-clock signal. The clock signal is supplied to a frequency divider circuit 14. The frequency divider circuit 14 converts the clock signal into a ½ frequency signal, a ¼ frequency signal, a ⅛ frequency signal, and a 1/16 frequency signal, and supplies each divided frequency signal to a frequency selection circuit 15.

The frequency selection circuit 15 selects one of the divided frequency signals according to a selection signal received from a terminal 16, and outputs the selected frequency signal from a terminal 17 as a main clock signal. The main clock signal is supplied to a CPU (which is not illustrated), for example. The selection signal is changed according to the mode of operation of the CPU.

In the meanwhile, there is known a clock controller system which includes a clock control circuit, a first oscillator circuit used for low-speed operation, and a second oscillator circuit used for high-speed operation. For example, refer to Japanese Laid-Open Patent Publication No. 08-272478.

In the known clock controller system, the clock control circuit performs on/off control of the two oscillator circuits according to the operating conditions of the system. A clock signal generated by the first oscillator circuit is supplied to a CPU and a CPU peripheral circuit respectively via a selector as a system clock signal in a low-speed operation mode.

At this time, the second oscillator circuit is kept in a halt state by an oscillation control signal from the clock control circuit.

In the related art oscillator circuit of FIG. 5, the oscillating frequency of the built-in oscillator 1 is constant even when the main clock signal is in a low-speed operation mode, so that it is difficult to reduce power dissipation of the related art oscillator circuit. Further, the related art oscillator circuit has a problem that the built-in oscillator 1 and the low-speed clock oscillator 6 must be provided independently of each other.

In the related art oscillator circuit of FIG. 6, the oscillating frequency of the PLL 13 is constant even when the main clock signal is in a low-speed operation mode, and it is difficult to reduce power dissipation of the related art oscillator circuit. Further, the related art oscillator circuit has a problem that the PLL 13 and the low-speed clock oscillator 11 must be provided independently of each other.

SUMMARY OF THE INVENTION

In one aspect, the present disclosure provides an oscillator circuit which has a simple composition and is capable of reducing power dissipation when the oscillating frequency is comparatively low.

In an embodiment which solves or reduces one or more of the above-described problems, the present disclosure provides an oscillator circuit including: a clock oscillator which outputs a main clock signal having an oscillating frequency switched between a high frequency and a low frequency in response to a frequency selection signal; and a frequency divider circuit which outputs a sub-clock signal having a divided frequency equivalent to a frequency division ratio of the oscillating frequency of the main clock signal, the frequency division ratio being switched in response to the frequency selection signal, wherein the divided frequency of the sub-clock signal is predetermined for each of the high frequency and the low frequency to which the oscillating frequency is switched in response to the frequency selection signal.

Other objects, features and advantages of the present disclosure will be apparent from the following detailed description when read in conjunction with the accompanying drawings.

DETAILED DESCRIPTION OF PREFERRED EMBODIMENTS

A description will be given of embodiments of the present disclosure with reference to the accompanying drawings.

Figure 1:
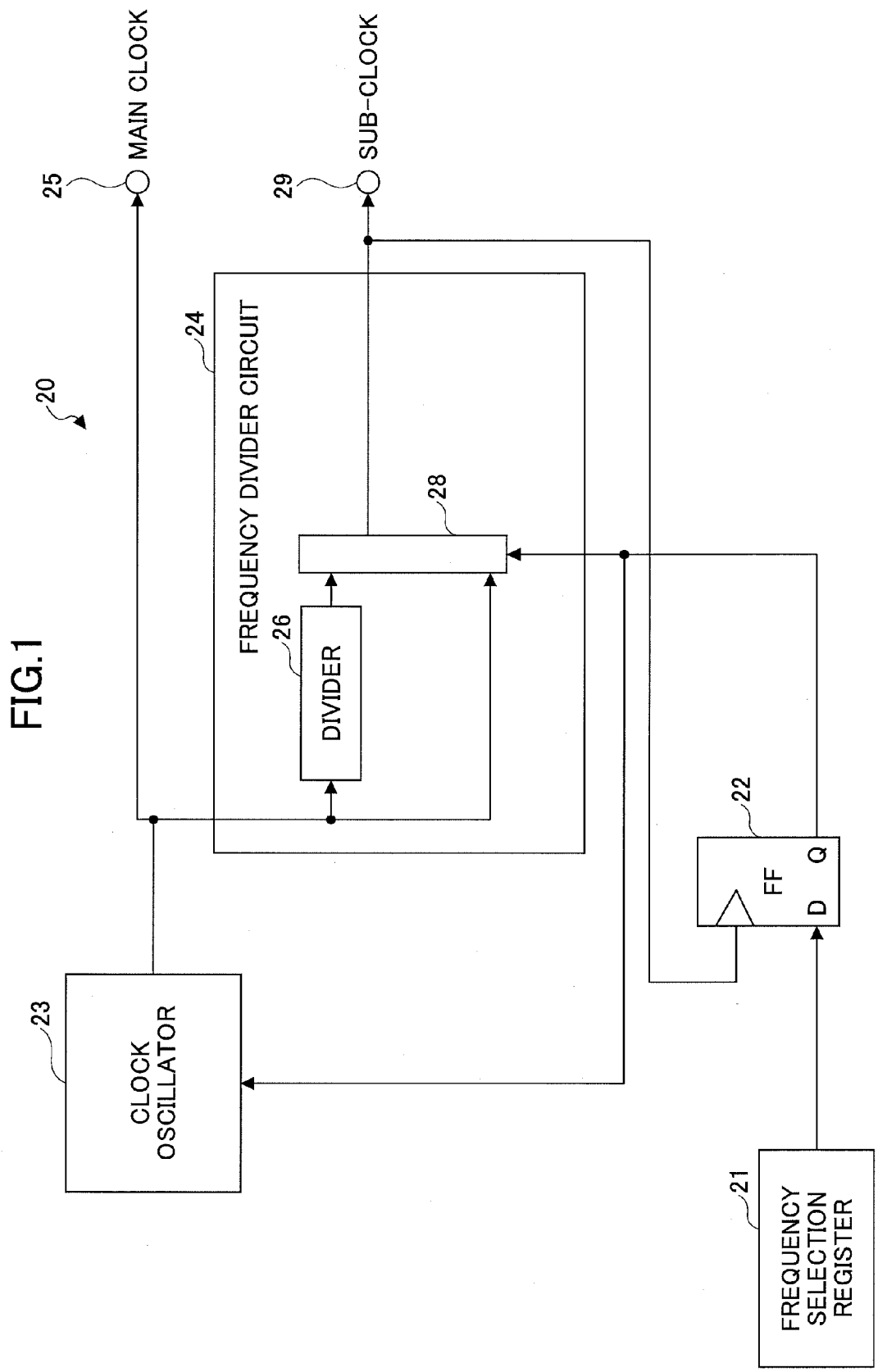
FIG. 1 is a block diagram showing the composition of an oscillator circuit of an embodiment of the present disclosure.

FIG. 1 is a block diagram showing the composition of an oscillator circuit 20 of an embodiment of the present disclosure. This oscillator circuit 20 is formed as a semiconductor integrated circuit.

In the oscillator circuit 20 of FIG. 1, a frequency selection signal is stored in a frequency selection register 21. The frequency selection signal is output from a CPU (which is not illustrated) and indicates the value 1 or the value 0. The frequency selection signal output from the frequency selection register 21 is supplied to a flip-flop 22. The frequency selection signal is synchronized with a sub-clock signal and stored in the flip-flop 22. The frequency selection signal output from the flip-flop 22 is supplied to a clock oscillator 23, and, at the same time, supplied to a selector 28 provided in a frequency divider circuit 24.

For example, the clock oscillator 23 sets its oscillating frequency to 154 kHz when the frequency selection signal indicates the value 1, and sets its oscillating frequency to 38.4 kHz when the frequency selection signal indicates the value 0. The clock oscillator 23 generates a clock signal with the thus selected oscillating frequency and outputs this clock signal as a main clock signal.

The oscillator circuit 20 supplies the main clock signal generated by the clock oscillator 23 from a terminal 25 to an external device. For example, the main clock signal is supplied to the CPU (which is not illustrated), and, at the same time, supplied to the frequency divider circuit 24.

The frequency divider circuit 24 includes a divider 26 and the selector 28. Each of the divider 26 and the selector 28 receives the main clock signal from the clock oscillator 23 respectively. The divider 26 generates a ¼ frequency signal from the received main clock signal and outputs the ¼ frequency signal to the selector 28.

When the frequency selection signal indicates the value 1, the selector 28 selects the ¼ frequency signal received from the divider 26. This ¼ frequency signal is the clock signal with the frequency of 38.4 kHz, which is generated by the divider 26 based on the clock signal with the frequency of 154 kHz received from the clock oscillator 23. When the frequency selection signal indicates the value 0, the selector 28 selects the clock signal with the frequency of 38.4 kHz received from the clock oscillator 23. The mode of selection as to which of the clock signal from the clock oscillator 23 and the clock signal from the divider 26 is selected by the selector 28 is switched in synchronization with the main clock signal output by the clock oscillator 23. As described above, the frequency selection signal is synchronized with the sub-clock signal and stored in the flip-flop 22. Hence, the switching of the mode of selection of the clock signal in the selector 28 is also in synchronization with the sub-clock signal.

The oscillator circuit 20 supplies the sub-clock signal with the frequency of 38.4 kHz selected by the selector 28 from a terminal 29 to an external device. For example, the sub-clock signal is supplied from the terminal 29 to a timer (which is not illustrated).

Figure 2:
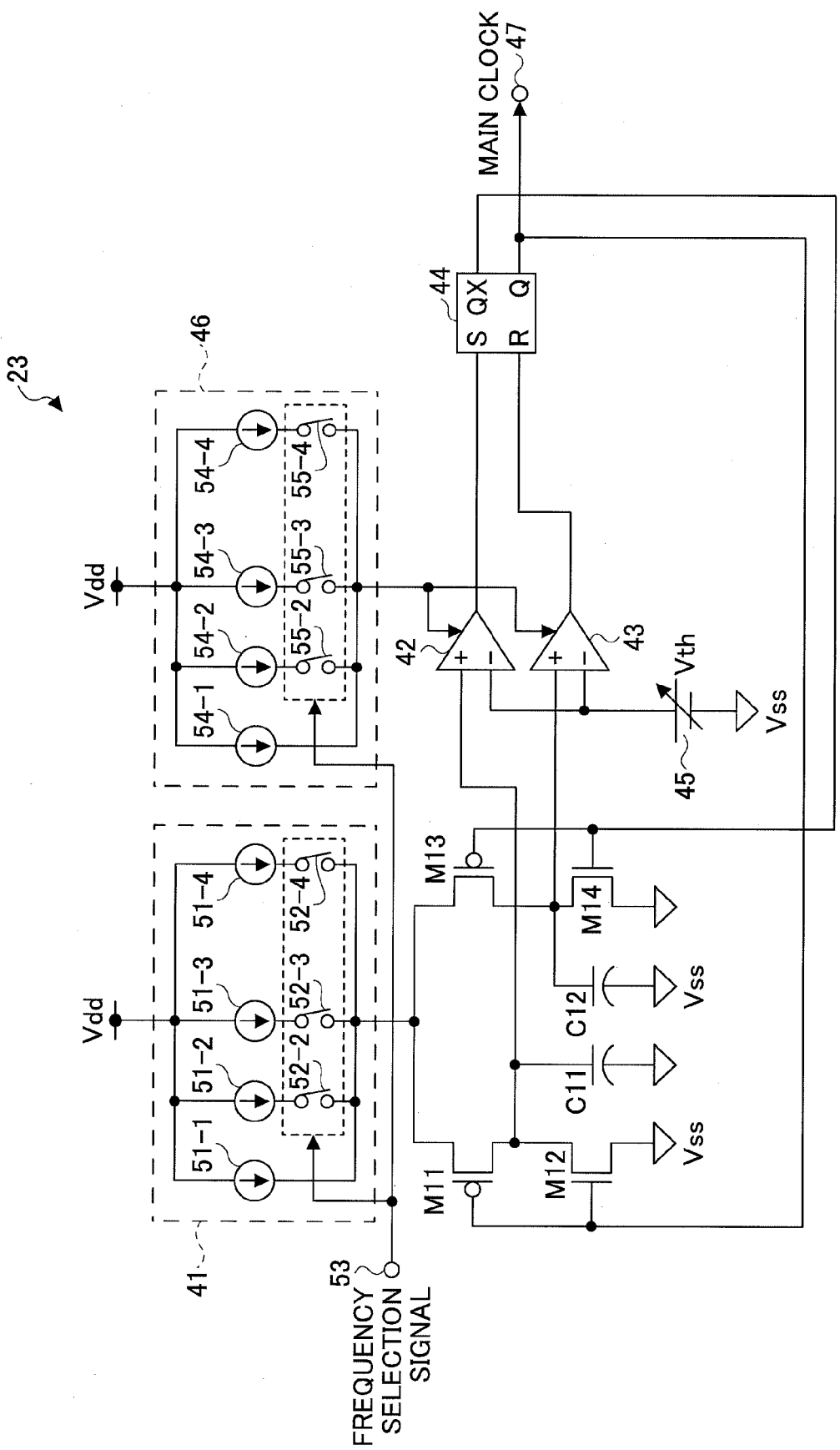
FIG. 2 is a diagram showing the circuit composition of a clock oscillator in the oscillator circuit of the present embodiment.

Next, FIG. 2 shows the circuit composition of the clock oscillator 23 in the oscillator circuit 20 of the present embodiment.

As shown in FIG. 2, the clock oscillator 23 generally includes a current circuit 41, a comparator 42, a comparator 43, an SR (set-reset) flip-flop 44, a constant-voltage circuit 45, a current circuit 46, a terminal 53, and a terminal 47. The SR flip-flop 44 is, for example, a set-reset latch circuit which is constructed to have S and R inputs and QX and Q outputs and operates to meet the logical equation Q=not QX.

The current circuit 41 is constructed to include constant-current sources 51-1 to 51-4 which are connected in parallel, and switches 52-2 to 52-4 which are connected in series to the constant-current source 51-2 to 51-4 respectively. One end of each constant-current source to which the constant-current sources 51-1 to 51-4 are connected in common is connected to the power supply line Vdd. The other end of the constant-current source 51-1 and the junction point of the switches 52-2 to 52-4 are connected to the common source of p-channel MOS transistors M11 and M13.

In the clock oscillator 23, the frequency selection signal input to the terminal 53 is supplied to the switches 52-2 to 52-4. When the frequency selection signal indicates the value 1, the switches 52-2 to 52-4 are turned on in response to the frequency selection signal. When the frequency selection signal indicates the value 0, the switches 52-2 to 52-4 are turned off in response to the frequency selection signal. For example, the operating current supplied to the source of the MOS transistors M11 and M13 in the case of the frequency selection signal indicating the value 1 is approximately 4 times as large as that in the case of the frequency selection signal indicating the value 0.

The drain of the MOS transistor Mil is connected to the drain of an n-channel MOS transistor M12, and the source of the MOS transistor M12 is connected to the power supply line Vss. The drain of the MOS transistor M13 is connected to the drain of an n-channel MOS transistor M14, and the source of the MOS transistor M14 is connected to the power supply line Vss.

The common drain of the MOS transistors M11 and M12 is connected to one end of a capacitor C11, and further connected to the non-inverted input terminal of the comparator 42. The other end of the capacitor C11 is connected to the power supply line Vss. The gates of the MOS transistors M11 and M12 are connected to the Q output terminal of the SR flip-flop 44. The common drain of the MOS transistors M13 and M14 is connected to one end of a capacitor C12, and further connected to the non-inverted input terminal of the comparator 43. The other end of the capacitor C12 is connected to the power supply line Vss. The gates of the MOS transistors M13 and M14 are connected to the QX output terminal of the SR flip-flop 44. As described above, the SR flip-flop 44 operates to meet the logical equation Q=not QX, namely, the value indicated by the QX output of the SR flip-flop 44 is inverse to the value indicated by the Q output of the SR flip-flop 44.

The operating current from the current circuit 46 is supplied to the comparators 42 and 43. The current circuit 46 is constructed to include constant-current sources 54-1 to 54-4 which are connected in parallel, and switches 55-2 to 55-4 which are connected in series to the constant-current sources 54-2 to 54-4 respectively. One end of each constant-current source to which the constant-current sources 54-1 to 54-4 are connected in common is connected to the power supply line Vdd. The other end of the constant-current source 54-1 and the junction point of the switches 55-2 to 55-4 are connected to the current-supply terminals of the comparators 42 and 43 respectively.

In the clock oscillator 23, the frequency selection signal input to the terminal 53 is supplied to the switches 55-2 to 55-4. When the frequency selection signal indicates the value 1, the switches 55-2 to 55-4 are turned on in response to the frequency selection signal. When the frequency selection signal indicates the value 0, the switches 55-2 to 55-4 are turned off in response to the frequency selection signal. For example, the operating current supplied to the comparators 42 and 43 in the case of the frequency selection signal indicating the value 1 is approximately 4 times as larger as that in the case of the frequency selection signal indicating the value 0.

The inverted input terminals of the comparators 42 and 43 are connected to one end of the constant-voltage circuit 45. A reference voltage Vth from the constant-voltage circuit 45 is supplied to each of the inverted input terminals of the comparators 42 and 43. The other end of the constant-voltage circuit 45 is connected to the power supply line Vss. The output of the comparator 42 becomes high when the voltage of the capacitor C11 is higher than the reference voltage Vth, and becomes low when the voltage of the capacitor C11 is lower than or equal to the reference voltage Vth. The output signal from the comparator 42 is supplied the set (S) input terminal of the flip-flop 44.

The output of the comparator 43 becomes high when the voltage of the capacitor C12 is higher than the reference voltage Vth, and becomes low when the voltage of the capacitor C12 is lower than or equal to the reference voltage Vth. The output signal from the comparator 43 is supplied to the reset (R) input terminal of the flip-flop 44.

If a high-level signal is supplied to the set (S) input terminal of the SR flip-flop 44, the Q output of the flip-flop 44 becomes high and the QX output of the flip-flop 44 becomes low. If a high-level signal is supplied to the reset (R) input terminal of the SR flip-flop 44, the Q output of the flip-flop 44 becomes low and the QX output of the flip-flop 44 becomes high. In the clock oscillator 23, the clock signal at the Q output terminal of the SR flip-flop 44 is output from the terminal 47 as the main clock signal.

Next, operation of the clock oscillator 23 will be described.

When the Q output terminal of the flip-flop 44 is at a low level, the MOS transistor M11 is turned on and the MOS transistor M12 is turned off, so that the capacitor C11 is charged. At the same time, the QX output terminal of the flip-flop 44 is at a high level. The MOS transistor M13 is turned off and the MOS transistor M14 is turned on, so that the capacitor C12 is discharged.

Subsequently, when the voltage of the capacitor C11 is higher than the reference voltage Vth, the output of the comparator 42 becomes high. The SR flip-flop 44 is set so that the Q output of the flip-flop 44 becomes high and the QX output of the flip-flop 44 becomes low.

At this time, the MOS transistor M11 is turned off and the MOS transistor M12 is turned on, so that discharging of the capacitor C11 is started. At the same time, the QX output terminal of the flip-flop 44 is at a low level. The MOS transistor M13 is turned on and the MOS transistor M14 is turned off, so that charging of the capacitor C12 is started.

Subsequently, when the voltage of the capacitor C12 rises and exceeds the reference voltage Vth, the output of the comparator 43 becomes high. The SR flip-flop 44 is reset so that the Q output of the flip-flop 44 becomes low and the QX output of the flip-flop 44 becomes high. The foregoing operation is repeatedly performed so that the clock generator 23 outputs the main clock signal from the terminal 47.

Next, the switching of the oscillating frequency of the clock oscillator 23 will be described.

When the frequency selection signal indicating the value 0 is received from the terminal 53, the switches 52-2 to 52-4 in the current circuit 41 are turned off. On the other hand, when the frequency selection signal indicating the value 1 is received from the terminal 53, the switches 52-2 to 52-4 in the current circuit 41 are turned on. The operating current supplied to the source of the MOS transistors M11 and M13 in the case of the frequency selection signal indicating the value 1 is approximately 4 times as large as that in the case of the frequency selection signal indicating the value 0. The charged current in the capacitors C11 and C12 in the case of the frequency selection signal indicating the value 1 is approximately 4 times as large as that in the case of the frequency selection signal indicating the value 0. Accordingly, the oscillating frequency of the clock oscillator 23 when the frequency selection signal indicates the value 1 is approximately 4 times as large as that when the frequency selection signal indicates the value 0.

The current capacity of the MOS transistor which forms each of the comparators 42 and 43 changes depending on ambient temperature. The delay time of each of the comparators 42 and 43 from a change of the input signal to a change of the output signal increases when the ambient temperature is high, and decreases when the ambient temperature is low.

In this embodiment, the time jitter of the delay times of the comparators 42 and 43 due to temperature changes is made sufficiently smaller than one cycle of the oscillating frequency, and stabilization of the frequency of the generated clock signal is possible. Specifically, when one cycle of the oscillating frequency is small, the delay time of the comparators 42 and 43 is reduced by increasing the operating current supplied to the comparators 42 and 43. The frequency changes of the clock oscillator 23 due to the temperature changes are made small, and the frequency/temperature characteristics are made small. Accordingly, power dissipation when the oscillating frequency is low can be reduced.

The switching of the oscillating frequency in the current circuit 41 is considered as being a coarse adjustment. Fine adjustment of the switching of the oscillating frequency may be performed by adjusting the reference voltage Vth supplied from the constant voltage circuit 45 to the comparators 42 and 43.

Figure 3:
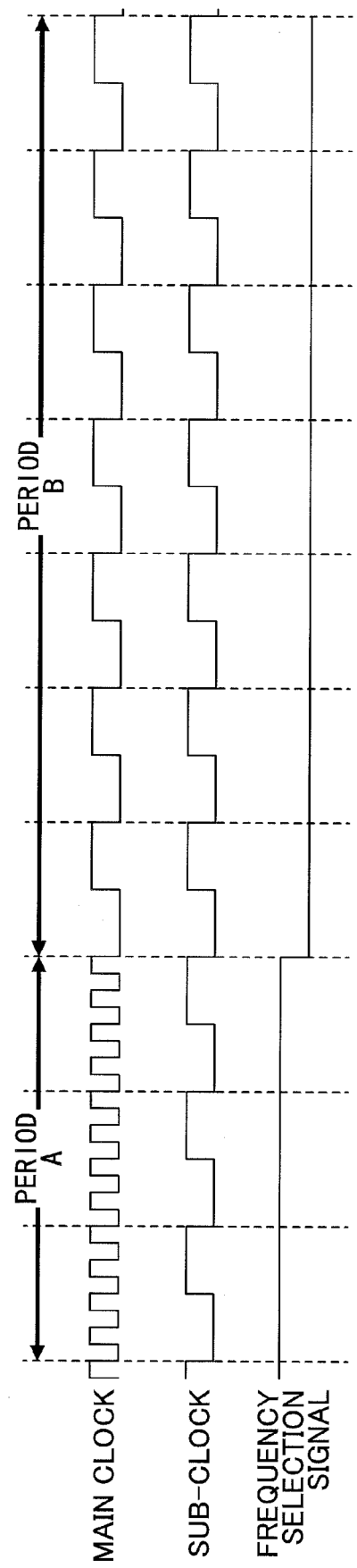
FIG. 3 is a timing chart for explaining operation of the oscillator circuit of the present embodiment at a time of switching of a clock frequency.

FIG. 3 is a timing chart for explaining operation of the oscillator circuit 20 of the present embodiment at a time of switching of the clock frequency.

As shown in FIG. 3, the main clock signal output from the clock oscillator 23 has the frequency of 154 kHz during the period A in which the frequency selection signal indicates the value 1. At this time, the selector 28 selects the clock signal with the frequency of 38.4 kHz output from the divider 26. The selected clock signal is the ¼ frequency signal generated by the divider 26 from the main clock signal with the frequency of 154 kHz output from the clock oscillator 23.

Subsequently, the value of the frequency selection signal is changed to the value 0 (period B). The main clock signal output from the clock oscillator 23 during the period B has the frequency of 38.4 kHz, and the selector 28 selects the main clock signal with the frequency of 38.4 kHz output from the clock oscillator 23. The frequency selection signal is synchronized with the sub-clock signal and stored in the flip-flop 22. Hence, the frequency of the main clock signal is switched in synchronization with the sub-clock signal.

Figure 4:
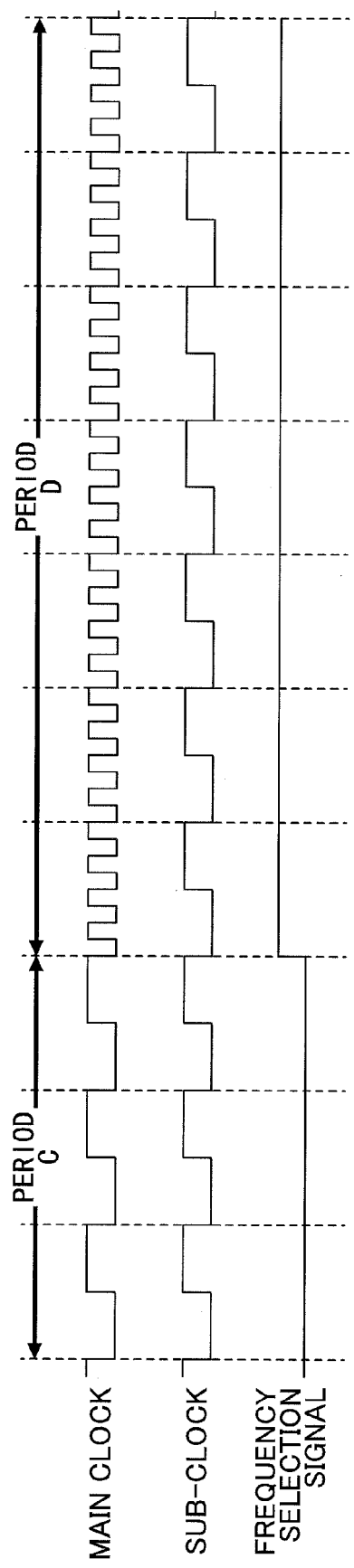
FIG. 4 is a timing chart for explaining operation of the oscillator circuit of the present embodiment at a time of switching of a clock frequency.
Figure 5:
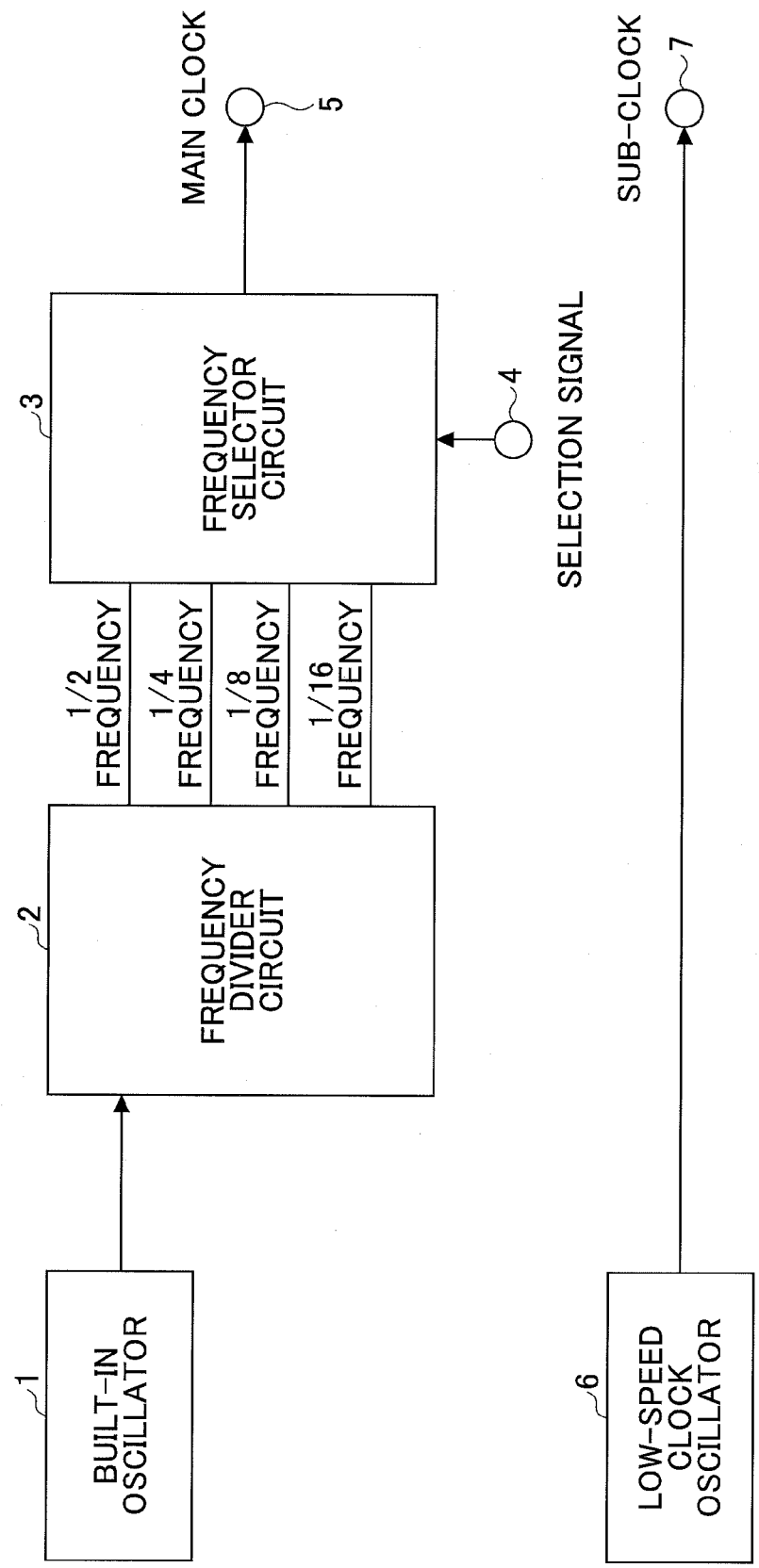
FIG. 5 is a block diagram showing the composition of an oscillator circuit according to the related art.
Figure 6:
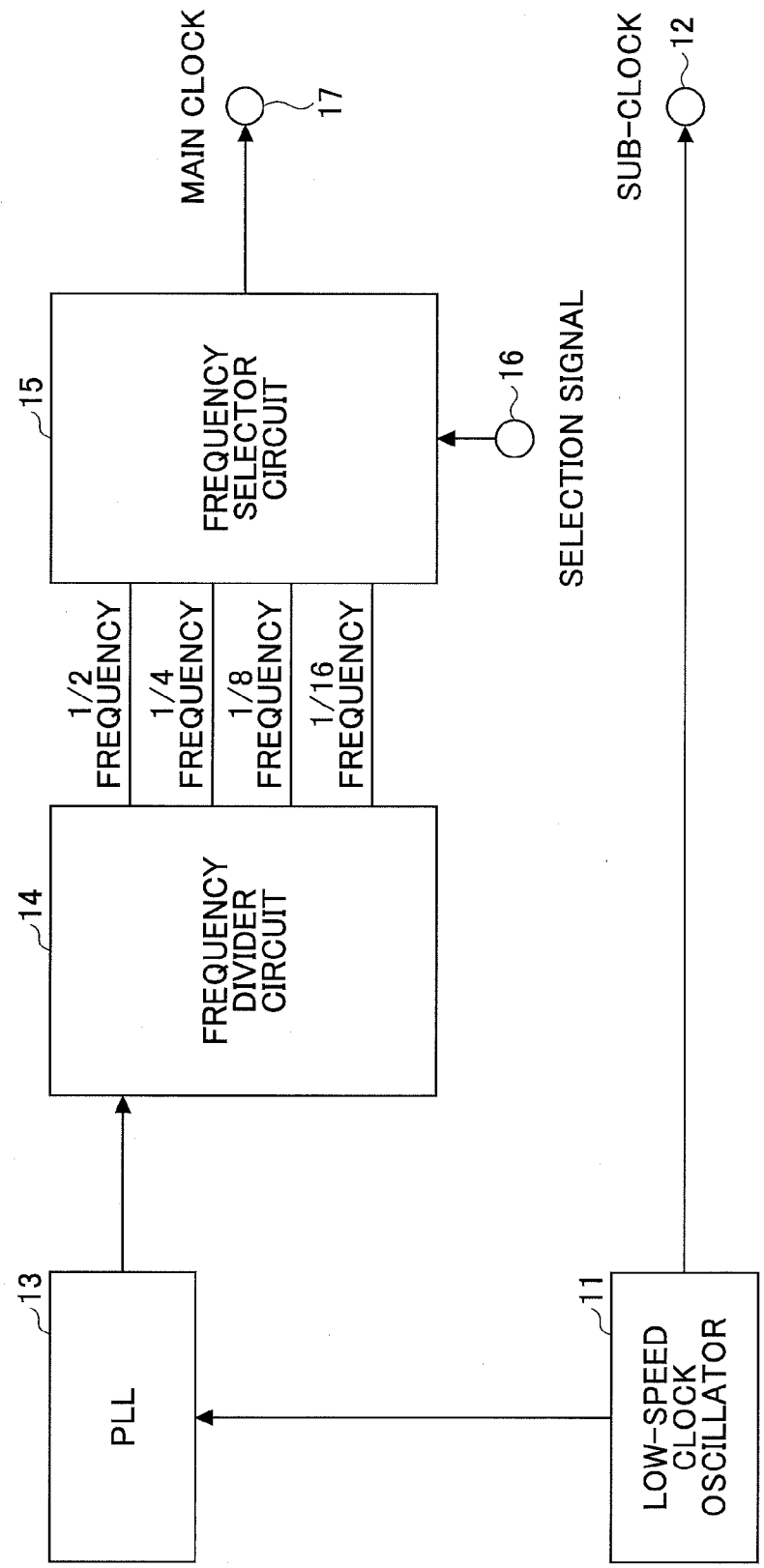
FIG. 6 is a block diagram showing the composition of another oscillator circuit according to the related art.

FIG. 4 is a timing chart for explaining operation of the oscillator circuit 20 of the present embodiment at a time of switching of the clock frequency.

As shown in FIG. 4, during the period C in which the frequency selection signal indicates the value 0, the main clock signal output from the clock oscillator 23 has the frequency of 38.4 kHz. At this time, the selector 28 selects the main clock signal with the frequency of 38.4 kHz output from the clock oscillator 23.

Subsequently, the value of the frequency selection signal is changed to the value 1 (period D). The main clock signal output from the clock oscillator 23 has the frequency of 154 kHz. The selector 28 selects the clock signal with the frequency of 38.4 kHz from the clock oscillator 23. The selected clock signal is the ¼ frequency signal generated by the divider 26 from the main clock signal with the frequency of 154 kHz. The frequency selection signal is synchronized with the sub-clock signal and stored in the flip-flop 22. The frequency of the main clock signal is switched in synchronization with the sub-clock signal.

As described in the foregoing, it is possible for the oscillator circuit of the present disclosure to have a simple composition and reduce power dissipation when the oscillating frequency is comparatively low.

The present disclosure is not limited to the above-described embodiments, and variations and modifications may be made without departing from the scope of the present disclosure.

What is claimed is:

1. An oscillator circuit, comprising:
   a clock oscillator which outputs a main clock signal having an oscillating frequency switched between a high frequency and a low frequency in response to a frequency selection signal;
   a frequency divider circuit which outputs a sub-clock signal having a divided frequency equivalent to a frequency division ratio of the oscillating frequency of the main clock signal, the frequency division ratio being switched in response to the frequency selection signal; and
   a synchronization part to make the frequency selection signal synchronized with the sub-clock signal,
   wherein the divided frequency of the sub-clock signal is predetermined for each of the high frequency and the low frequency to which the oscillating frequency is switched in response to the frequency selection signal.

2. The oscillator circuit according to claim 1, wherein the clock oscillator comprises:
   a charging/discharging part which selects one of charging and discharging of a capacitor in response to a control signal;
   a comparator which outputs a comparison result signal indicating a result of comparison of a voltage of the capacitor with a reference voltage;
   a flip-flop which is set or reset by the comparison result signal output from the comparator, to supply an output signal to the charging/discharging part as the control signal, and to supply the output signal as the main clock signal; and
   a first current circuit which switches a charged current in the capacitor in response to the frequency selection signal.

3. The oscillator circuit according to claim 2, wherein the clock oscillator further comprises a second current circuit which switches an operating current supplied to the comparator in response to the frequency selection signal.

* * * * *